(12) United States Patent
Murai et al.

(10) Patent No.: US 6,883,901 B2
(45) Date of Patent: Apr. 26, 2005

(54) PIEZOELECTRIC ELEMENT, LIQUID JETTING HEAD, AND METHOD FOR MANUFACTURING THEREOF

(75) Inventors: Masami Murai, Nagano (JP); Xin-Shan Li, Nagano (JP)

(73) Assignee: Seiko Epson Corporation (JP)

( * ) Notice: Subject to any disclaimer, the term of this patent is extended or adjusted under 35 U.S.C. 154(b) by 99 days.

(21) Appl. No.: 10/348,340

(22) Filed: Jan. 22, 2003

(65) Prior Publication Data

US 2003/0227518 A1 Dec. 11, 2003

(30) Foreign Application Priority Data

| Jan. 22, 2002 | (JP) | ................................ 2002-012714 |
| Jan. 29, 2002 | (JP) | ................................ 2002-019807 |
| Jul. 17, 2002 | (JP) | ................................ 2002-208641 |
| Jan. 10, 2003 | (JP) | ................................ 2003-005116 |

(51) Int. Cl.$^7$ ................................................. B41J 2/045
(52) U.S. Cl. ........................................ 347/68; 347/71
(58) Field of Search .................. 347/68–72; 310/311, 310/328, 357, 358, 365

(56) References Cited

U.S. PATENT DOCUMENTS 6,494,567 B2 * 12/2002 Murai .......................... 347/71

FOREIGN PATENT DOCUMENTS

| JP | 2-177578 | 7/1990 |
| JP | 6-5948 | 1/1994 |
| JP | 6-116095 | 4/1994 |
| JP | 8-335676 | 12/1996 |
| JP | 9-69614 | 3/1997 |
| JP | 10-81016 | 3/1998 |
| JP | 10-86365 | 4/1998 |
| JP | 2000-22232 | 1/2000 |

* cited by examiner

Primary Examiner—Stephen D. Meier
Assistant Examiner—An H. Do
(74) Attorney, Agent, or Firm—Sterne, Kessler, Goldstein & Fox P.L.L.C.

(57) ABSTRACT

The present invention provides a piezoelectric element having consistently high piezoelectric characteristics, and a method for manufacturing a liquid jetting head in which this element is used, by obtaining a degree of orientation that is suitable for a piezoelectric thin film, stably and with good reproducibility. A Ti film is formed on a layered bottom electrode 42, piezoelectric material layers constituting a piezoelectric thin film 43 is formed a plurality of cycles of layer formation, and a top electrode 44 is formed on the piezoelectric thin film 43 to produce a piezoelectric element 40. When the piezoelectric material layers are formed, the annealing temperature of the first cycle of layer formation is set higher than the annealing temperature of the other cycles of layer formation. In addition, the annealing time of the first cycle of layer formation is made longer than the annealing time of the other cycles of layer formation. The degree of orientation in the 100 plane is thereby increased, and the bottom electrode can be prevented from undergoing oxidation or Pd diffusion.

5 Claims, 8 Drawing Sheets

1: INK-JET RECORDING HEAD

PIEZOELECTRIC ELEMENT, LIQUID JETTING HEAD, AND METHOD FOR MANUFACTURING THEREOF

CROSS-REFERENCE TO RELATED APPLICATIONS

Not applicable.

STATEMENT REGARDING FEDERALLY-SPONSORED RESEARCH AND DEVELOPMENT

Not applicable.

REFERENCE TO MICROFICHE APPENDIX/SEQUENCE LISTING/TABLE/COMPUTER PROGRAM LISTING APPENDIX (Submitted on a Compact Disc and an Incorporation-By-Reference of the Material on the Compact Disc)

Not applicable.

BACKGROUND OF THE INVENTION

1. Field of the Invention

The present invention relates to a piezoelectric element having electromechanical conversion functionality, a liquid jetting head featuring this piezoelectric element, and a method for manufacturing these. More particularly, the invention relates to a piezoelectric element that has excellent piezoelectric characteristics when used in a liquid jetting head, to a liquid jetting head featuring this, and to a method for manufacturing these.

2. Related Art

Inkjet recording heads and other liquid jetting heads use piezoelectric elements as drive sources for expelling ink drops and other liquid drops. Such piezoelectric elements commonly comprise piezoelectric thin films and top and bottom electrodes disposed on both sides thereof.

Piezoelectric elements with improved characteristics have been developed by designing a thin-film crystal structure that comprises lead zirconate titanate (PZT), and forming a Ti nucleus on the bottom electrode. For example, a PZT thin film that has a rhombohedral crystal structure and a specific degree of orientation is disclosed in Japanese Patent Publication No. H10-81016. Further, a piezoelectric element in which a Ti nucleus is formed on an Ir bottom electrode is disclosed in Japanese Patent Publication No. H8-335676.

In conventional steps for manufacturing piezoelectric elements, however, problems are encountered such that the desired degree of orientation of crystal planes in a piezoelectric thin film is difficult to obtain in a stable manner. With such piezoelectric elements, high piezoelectric characteristics are difficult to obtain in a stable manner as a result of the fact that the degree of orientation of the crystal plane is unstable. This is a factor that makes it difficult to achieve an adequate printing performance in an inkjet recording head or printer.

Meanwhile, forming a PZT thin film on a platinum film by a sol-gel technique in six separate cycles is disclosed in Japanese Patent publication No. H6-5948 as a method for producing memory cells, capacitors, and other ferroelectric thin-film elements. In particular, the annealing temperature in the first two steps is set higher than in the other four steps, and the annealing time in the last two steps is made greater than in the other four steps.

However, even this method fails to yield an orientation that would be suitable for piezoelectric elements.

Another drawback is that the reliability is not sufficient because significant in-film stress develops in the conventional piezoelectric material films and bottom electrodes.

In addition, no consideration is given in the conventional steps for manufacturing piezoelectric elements to the take-up of the Ti nucleus by piezoelectric thin-film. For this reason, a problem is encountered whereby areas that are rich in Ti and have a discontinuous composition remain on the interface between the piezoelectric thin film (PZT) and the bottom electrode (BE), as shown in FIGS. 8A and 9A. Consequently, it is sometimes difficult to ensure adequate piezoelectric characteristics or reliability as a result of the fact that the Zr/Ti ratio of a piezoelectric thin-film is nonuniform in the film thickness direction and that in-film stress remains in the piezoelectric thin-film.

SUMMARY OF THE INVENTION

An object of the present invention is to provide a piezoelectric element having consistently high piezoelectric characteristics, and to provide a method for manufacturing a liquid jetting head in which this element is used, by stabilizing and obtaining with good reproducibility a degree of orientation that is suitable for a piezoelectric thin film. Another object is to provide a highly reliable piezoelectric element in which the in-film stress of the piezoelectric material film and bottom electrode is reduced, and to provide a liquid jetting head in which this element is used.

Yet another object is to provide a method capable of yielding a piezoelectric thin film whose composition is uniform in the film thickness direction, and of reducing the in-film stress; to provide a piezoelectric element endowed with good piezoelectric characteristics and reliability; and to provide a liquid jetting head in which this element is used.

According to a method for manufacturing a piezoelectric element in accordance with the present invention, a Ti film is formed on a layered bottom electrode, a piezoelectric material layers are then formed in a plurality of cycles of layer formation to produce a PZT piezoelectric thin film predominantly oriented in the 100 plane, and a top electrode is formed on the piezoelectric thin film. When the piezoelectric material layers are formed in a plurality of cycles, the annealing temperature of the initial cycle of layer formation is set higher than the annealing temperature of the other cycles of layer formation. The electromechanical conversion functionality of the piezoelectric element is excellent in the case of a piezoelectric thin film predominantly oriented in the 100 plane. The piezoelectric material layer formed during the initial cycle greatly affects the subsequently layered piezoelectric material layers.

In the above-described manufacturing method, it is preferable that the annealing temperature of the initial cycle of layer formation is set higher than the temperature at which the layered bottom electrode undergoes interdiffusion. In addition, it is also preferable that the annealing temperature of the other cycles of layer formation is set below the temperature at which the layered bottom electrode undergoes interdiffusion. A piezoelectric thin film predominantly oriented in the 100 plane can be obtained by increasing the annealing temperature of the initial cycle. In addition, the layered bottom electrode undergoes interdiffusion and becomes uniform during the annealing of the initial cycle. However, excessively promoting interdiffusion in the bottom electrode is undesirable because of insufficient adhesiveness and other problems.

The method for manufacturing a piezoelectric element in accordance with the present invention can provide the same effects as above by making the annealing time during the initial cycle of layer formation longer than the annealing time during the other cycles of layer formation when a piezoelectric material layers are formed.

In the above-described manufacturing method, it is preferable that the annealing to form each piezoelectric material layer is carried out by performing heating from the side of the bottom electrode. It is also preferable that the piezoelectric thin film is formed by the sol-gel technique or MOD technique.

In addition, a method for manufacturing a piezoelectric element in accordance with the present invention entails forming a Ti film on the bottom electrode, then forming a piezoelectric material layers composed of PZT in a plurality of cycles of layer formation by the sol-gel technique to produce a piezoelectric thin film, and forming a top electrode on the piezoelectric thin film. The Zr/Ti ratio of the sol applied during the initial cycle of layer formation to form the first layer is set higher than the Zr/Ti ratio of the sol to form the other layers when the piezoelectric material layers are formed.

In the manufacturing methods described above, it is preferable that the Ti film is formed in a thickness of no less than 3 nm and no more than 7 nm, and the bottom electrode contains at least Ir.

In addition, the present invention resides in a method for manufacturing a liquid jetting head that comprises a piezoelectric element manufactured by the above-described manufacturing methods. The manufacturing method comprises a step for forming a diaphragm on one side of a substrate, a step for forming the piezoelectric element on the diaphragm, and a step for etching the substrate to form pressure chambers.

In addition, the piezoelectric element of the present invention is a piezoelectric element obtained by the sequential layering of a diaphragm, a bottom electrode, a piezoelectric thin film, and a top electrode, wherein the piezoelectric thin film is a PZT predominantly oriented in the 100 plane and that the degree of orientation in the (100) plane is different between the portion facing the bottom electrode and the portion facing the top electrode.

In the above-described piezoelectric element, it is preferable that the degree of orientation in the (100) plane of the portion of the piezoelectric thin film facing the top electrode is higher than the degree of orientation in the (100) plane of the portion facing the bottom electrode.

Another feature of the above-described piezoelectric element is that the piezoelectric thin film should comprise continuous columnar crystals that extend from the side of the bottom electrode to the side of the top electrode.

Another piezoelectric element of the present invention comprises a bottom electrode, a piezoelectric thin film formed on the bottom electrode, and a top electrode formed on the piezoelectric thin film, wherein at least those portions of the piezoelectric thin film near the interface with the bottom electrode have a uniform composition in the film thickness direction except at the crystal grain boundaries of the piezoelectric material.

In addition, the liquid jetting head of the present invention comprises piezoelectric elements, pressure chambers for varying the capacity by the mechanical displacement of the piezoelectric elements, and nozzles connected to the pressure chambers and used to eject liquid drops.

BRIEF DESCRIPTION OF THE DRAWINGS/ FIGURES

DETAILED DESCRIPTION OF THE INVENTION

1. Overall Structure of Inkjet Printer

Figure 1:
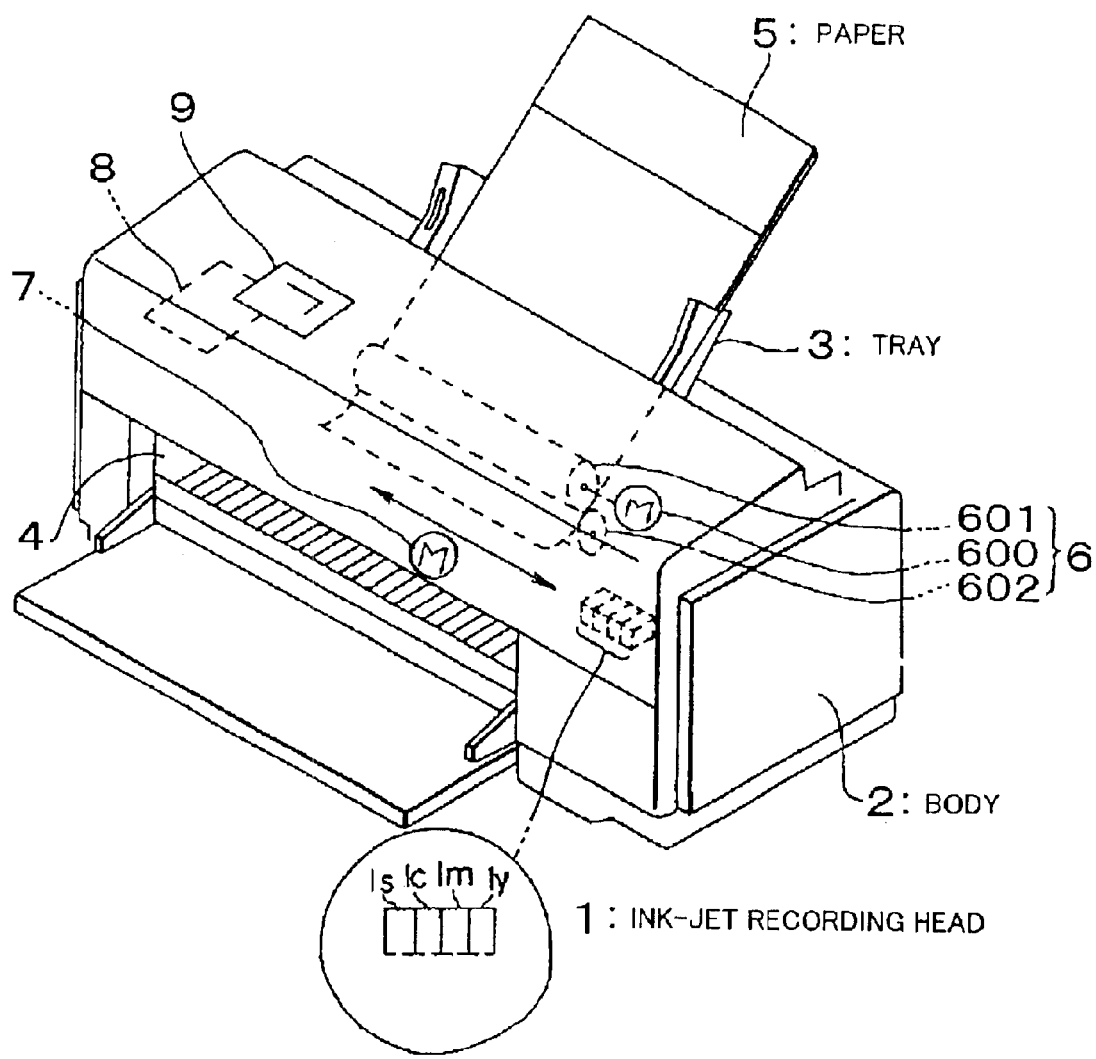
FIG. 1 is a perspective view illustrating a printer mechanism obtained using a piezoelectric element according to an embodiment of the present invention.

FIG. 1 is perspective view illustrating a structure of a printer as a liquid jetting apparatus featuring the piezoelectric elements of an embodiment of the present invention. The printer comprises a main body 2, a tray 3, a release port 4, and an operating button 9. In addition, the main body 2 contains an inkjet recording head 1 as a liquid jetting head, as well as a paper feeder mechanism 6 and a control circuit 8.

The inkjet recording head 1 comprises a plurality of piezoelectric elements formed on a substrate, and is configured such that liquid ink can be ejected from nozzles in accordance with discharge signals supplied from the control circuit 8.

In the main body 2, which is the printer casing, the paper feeder mechanism 6 is disposed at a position in which paper 5 can be fed from the tray 3, and the inkjet recording head 1 is disposed such that paper 5 can be printed on. The tray 3 is configured such that clean paper 5 can be fed to the paper feeder mechanism 6, and the release port 4 is an outlet for discharging paper 5 after printing has been completed.

The paper feeder mechanism 6 comprises a motor 600, rollers 601 and 602, and other mechanical structures (not shown). The motor 600 can rotate in accordance with drive signals supplied from the control circuit 8. The mechanical structures are configured to allow the rotational force of the motor 600 to be transmitted to the rollers 601 and 602. The rollers 601 and 602 are adapted to rotate when the rotational force of the motor 600 is transmitted, and are adapted to pull in the paper 5 from the tray 3 by means of rotation and to allow printing to be performed by the head 1.

The control circuit 8 comprises a CPU, ROM, RAM, interface circuit, and the like (not shown) and is adapted to supply a drive signal to the paper feeder mechanism 6 or a discharge signal to the inkjet recording head 1 in accordance with printing information supplied from the computer via a connector (not shown). In addition, the control circuit 8 is adapted to allow operating modes to be set, resetting to be performed, and other actions to be taken in accordance with the operating signals from a control panel 9.

The printer of the present embodiment comprises the below-described inkjet recording head having consistently high piezoelectric characteristics and a good printing performance, and is therefore a high-performance printer.

2. Structure of Inkjet Recording Head

Figure 2:
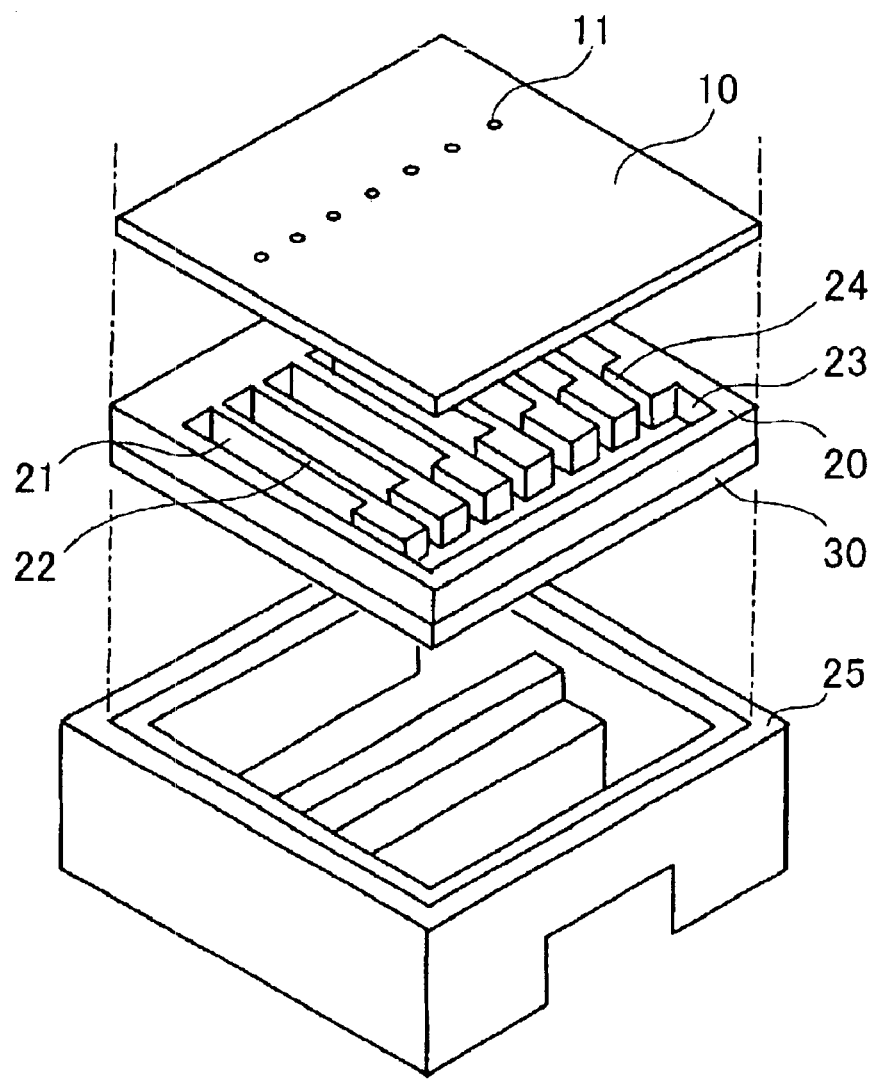
FIG. 2 is a cutaway perspective view depicting a partial structure of an inkjet recording head as a liquid jetting head according to an embodiment of the present invention.

FIG. 2 is a cutaway perspective view depicting a partial structure of the inkjet recording head according to an embodiment of the present invention.

The inkjet recording head comprises a nozzle plate 10, a pressure chamber substrate 20, and a diaphragm 30, as shown in FIG. 2.

The pressure chamber substrate 20 comprises pressure chambers (cavities) 21, side walls 22, a reservoir 23, and supply openings 24. The pressure chambers 21 are formed as storage spaces for discharging the ink or the like by the etching of silicon or another substrate. The side walls 22 are formed to partition the pressure chambers 21. The reservoir 23 serves as a common conduit for feeding the ink to the pressure chambers 21 via the supply openings 24.

The nozzle plate 10 is formed on one side of the pressure chamber substrate 20 such that the nozzles 11 thereof are disposed at positions that correspond to the pressure chambers 21 formed in the pressure chamber substrate 20.

The diaphragm 30 is an element formed by layering an oxide film 31 and a $ZrO_2$ film 32 on the other side of the pressure chamber substrate 20, as described below. The diaphragm 30 is provided with an ink tank connection port (not shown) to allow the ink stored in the ink tank (not shown) to be fed to the reservoir 23 of the pressure chamber substrate 20.

The head unit comprising the nozzle plate 10, diaphragm 30, and pressure chamber substrate 20 is placed in a casing 25, completing the inkjet recording head 1.

3. Structure of Piezoelectric Element

Figure 3A:
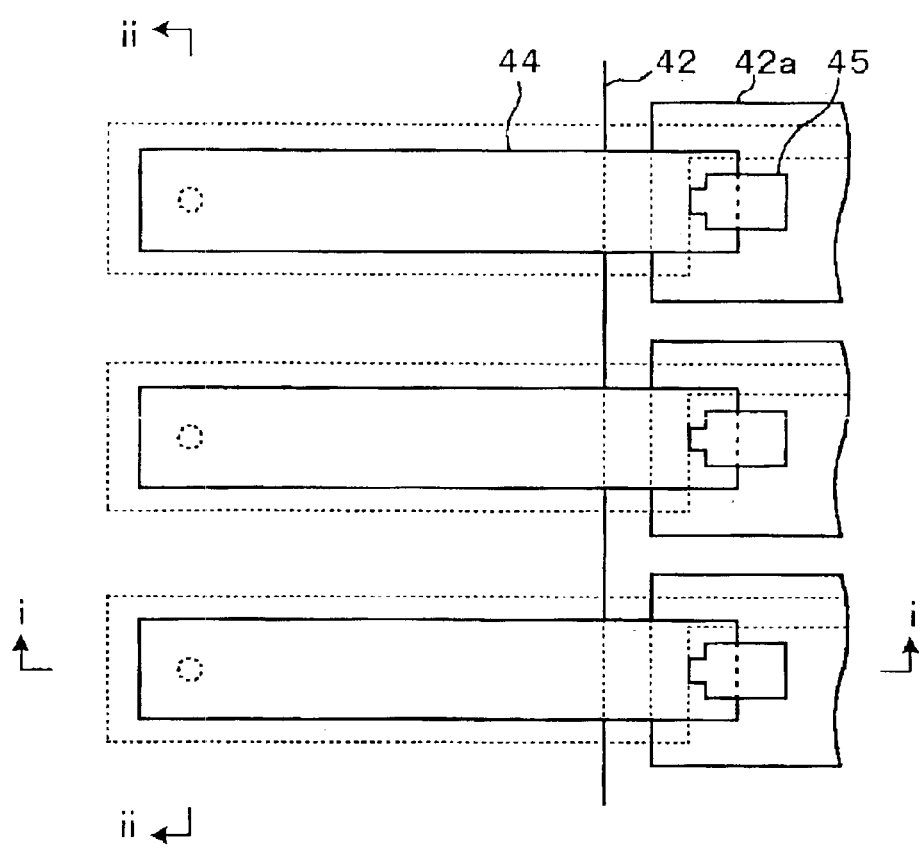
FIG. 3A is an enlarged plane view of the piezoelectric element portion of the aforementioned inkjet recording head.
Figure 3B:
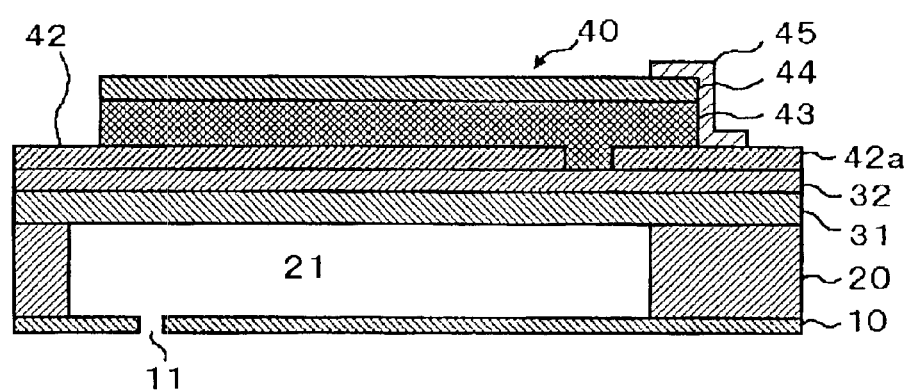
FIG. 3B is a cross-sectional view along line i—i of FIG. 3A.
Figure 3C:
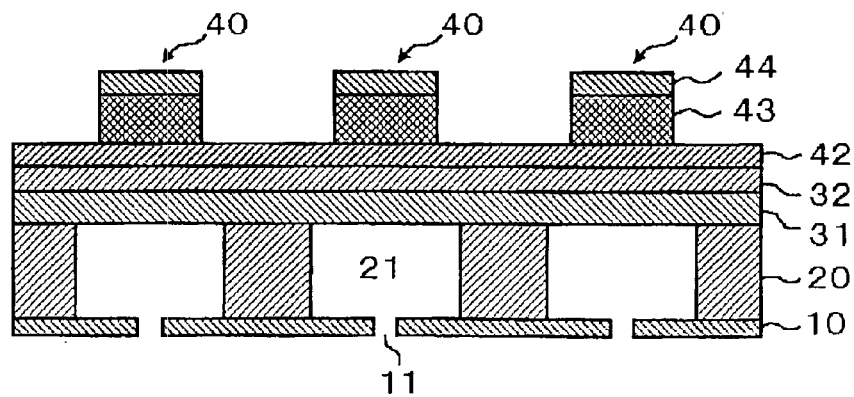
FIG. 3C is a cross-sectional view along line ii—ii of FIG. 3A.

FIG. 3A is an enlarged plane view of the piezoelectric element portion of the aforementioned inkjet recording head, FIG. 3B is a cross-sectional view along line i—i of FIG. 3A, and FIG. 3C is a cross-sectional view along line ii—ii of FIG. 3A.

Each piezoelectric element 40 is obtained by the successive layering of a $ZrO_2$ film 32, a bottom electrode 42, a piezoelectric thin film 43, and a top electrode 44 on an oxide film 31, as shown in FIG. 3B.

The oxide film 31 is formed as an insulating film on the pressure chamber substrate 20, which is composed, for example, of a piece of single-crystal silicon with a thickness of 220 $\mu$m. In preferred practice, a film composed of silicon oxide ($SiO_2$) can be formed in a thickness of 1.0 $\mu$m.

The $ZrO_2$ film 32, which is an elasticity-imparting layer, is integrated with the oxide film 31 to form the diaphragm 30. The $ZrO_2$ film 32 is preferably fashioned to a thickness of no less than 200 nm and no more than 800 nm in order to ensure elasticity-imparting functionality.

An adhesive layer (not shown) composed of a metal (preferably titanium or chromium) capable of bonding the two layers is preferably interposed between the $ZrO_2$ film 32 and the bottom electrode 42. The adhesive layer may be composed of alloy of titanium and chromium. The adhesive layer, which is formed in order to improve adhesion to the mounting surface of the piezoelectric element, has a thickness of about 10 nm.

The bottom electrode 42 has a layered structure that contains at least an Ir-containing layer; for example, a layered structure having the following layer sequence, from the bottom up: Ir-containing layer/Pt-containing layer/Ir-containing layer. The total thickness of the bottom electrode 42 may, for example, be 200 nm.

The layer structure of the bottom electrode 42 is not limited to the above option and may be a two-layer structure such as Ir-containing layer/Pt-containing layer or Pt-containing layer/Ir-containing layer.

The piezoelectric thin film 43 is a ferroelectric film comprising a plurality of layers composed of a piezoelectric ceramic crystal, preferably lead zirconate titanate (PZT) or another ferroelectric piezoelectric material, or a material obtained by adding niobium oxide, nickel oxide, magnesium oxide, or another metal oxide thereto.

The degree of orientation of the piezoelectric thin film 43 in the 100 plane is preferably 70% or greater, and particularly 80% or greater, as measured by the X-ray diffraction wide angle technique. Excellent piezoelectric characteristics can be obtained in this manner. The degree of orientation in the 110 plane is 10% or less, and the rest is the degree of orientation in the 111 plane. The sum of the degree of orientation in the 100 plane, the degree of orientation in the 110 plane, and the degree of orientation in the 111 plane is 100%.

As used herein, the term "degree of orientation in the 100 plane" refers to the ratio of I(100) to the sum of I(100), I(110), and I(111), where I(XYZ) is the diffracted intensities of peaks (2θ) that correspond to the XYZ planes when the CuKα beam is used in the X-ray diffraction wide angle technique.

The thickness of the piezoelectric thin film 43, which should be controlled to a degree at which cracking is prevented during manufacturing steps, and at the same time must be sufficiently large to yield adequate displacement characteristics, may, for example, be set to no less than 1000 nm and no more than 1500 nm.

The top electrode 44, which is an electrode that constitutes a pair with the bottom electrode 42, is preferably composed of Pt or Ir. The thickness of the top electrode 44 is preferably about 50 nm.

The bottom electrode 42 serves as a common electrode for the piezoelectric elements. By contrast, a wiring bottom electrode 42a is disposed in a layer of the same height as the bottom electrode 42, but is separated from the bottom electrode 42 and other bottom wiring electrodes 42a, and provides a conduction path to the top electrode 44 via a band electrode 45.

4. Operation of Inkjet Recording Head

Following is a description of the printing operation performed by the inkjet recording head 1 thus configured. When a drive signal is output by the control circuit 8, the paper feeder mechanism 6 is actuated and paper 5 is transported to the position at which printing can be performed by the head 1. No deformation is induced in the piezoelectric film 43 if no discharge signal is supplied from the control circuit 8 and if no drive voltage is applied between the bottom electrode 42 and top electrode 44 of a piezoelectric element. No pressure variations occur in the cavity 21 whose piezoelectric element does not receive any discharge signal, and no ink drops are discharged from the corresponding nozzle 11.

By contrast, deformation is induced in the piezoelectric film 43 when a discharge signal is supplied from the control circuit 8, and a drive voltage is applied between the bottom electrode 42 and the top electrode 44 of the piezoelectric element. The diaphragm 30 adjacent to the cavity 21 corresponding to a piezoelectric element that received the discharge signal is strongly bent. For this reason, the pressure inside the cavity 21 momentarily increases, and an ink drop is ejected from the nozzle 11. Arbitrary characters or figures can be printed by the individual supply of discharge signals to the piezoelectric elements in the head in accordance with visual data.

5. Manufacturing Method According to the First Embodiment

Figure 4:
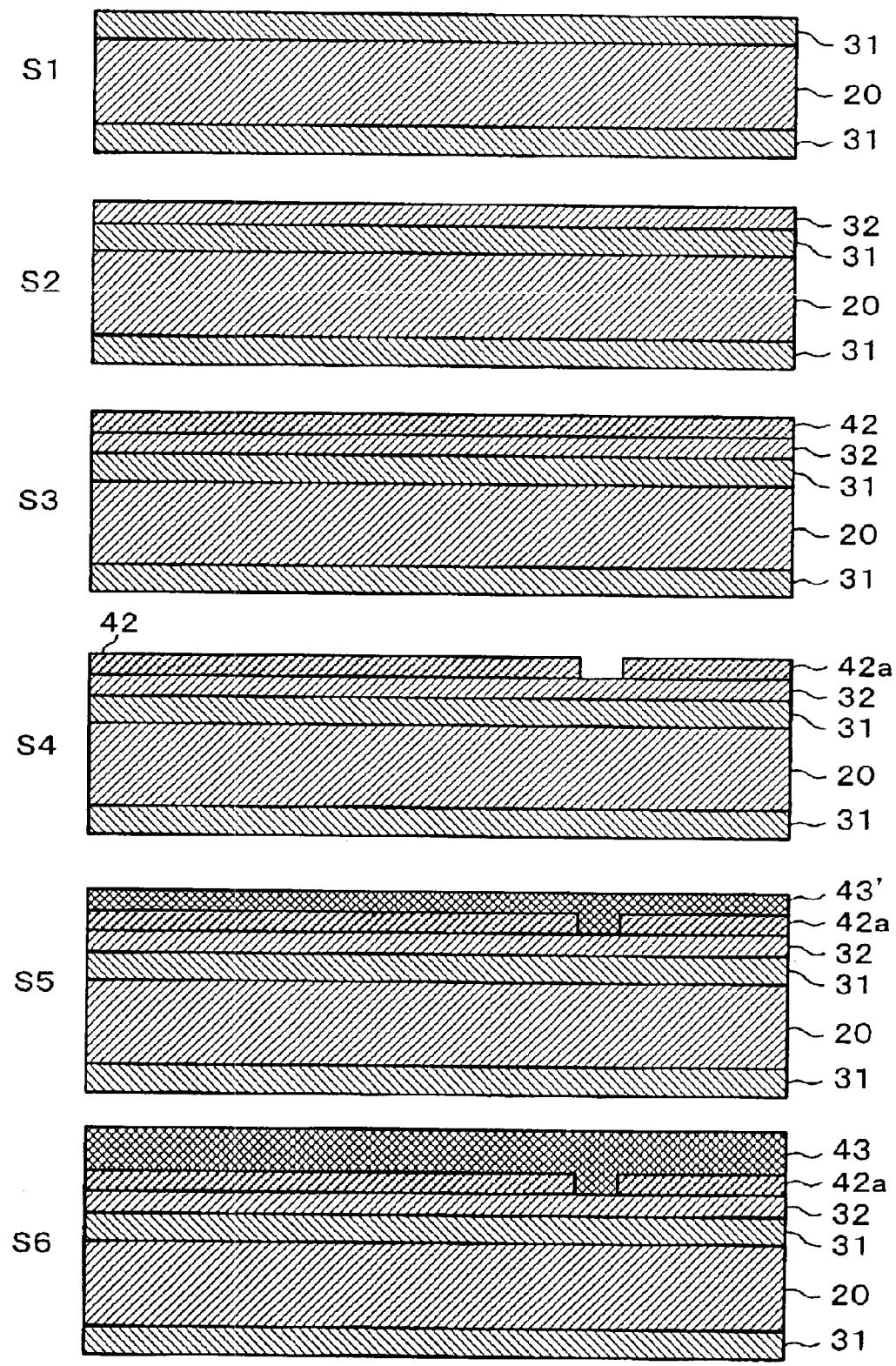
FIG. 4 is a cross-sectional schematic view depicting a method for manufacturing the inkjet recording head.
Figure 5:
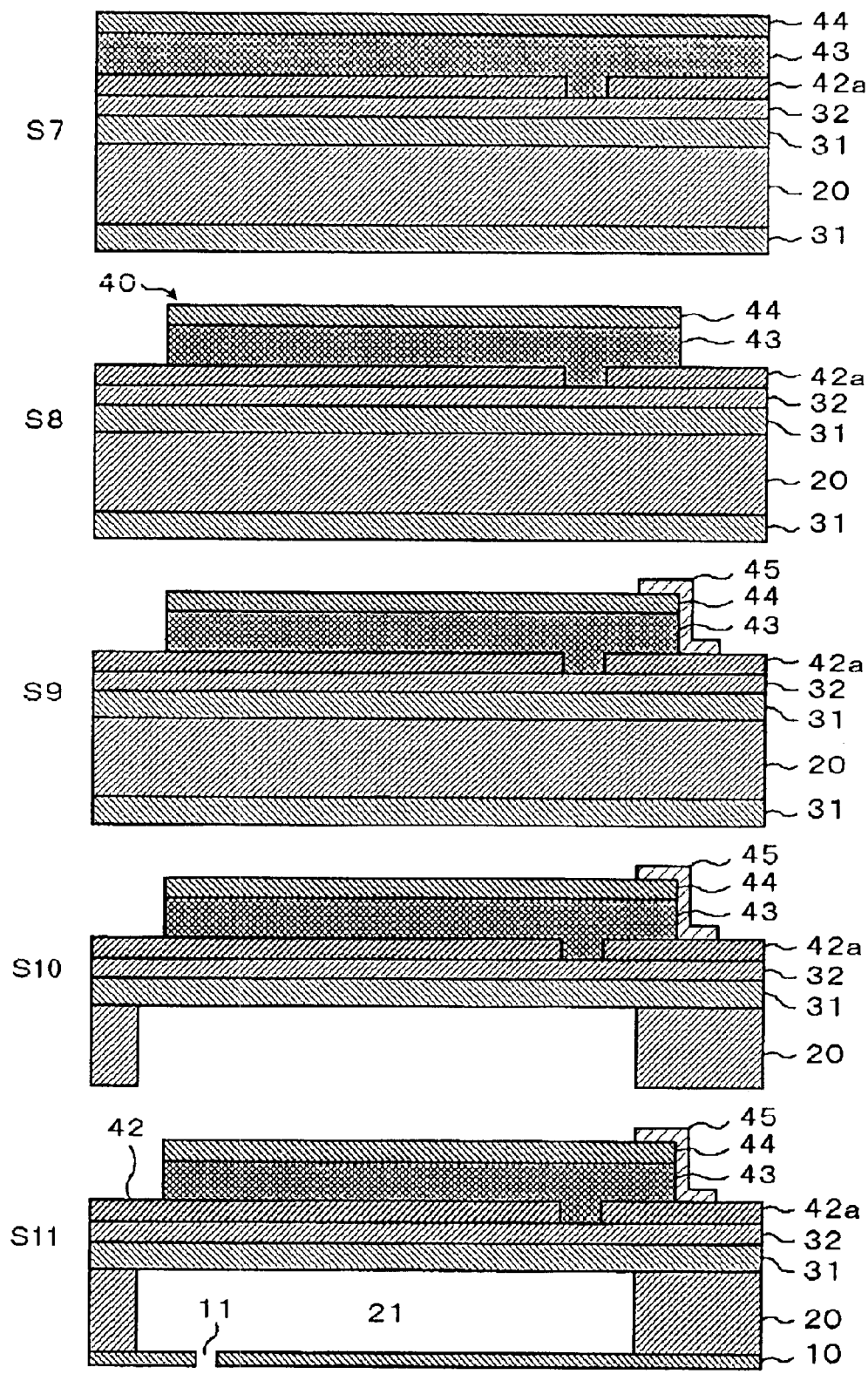
FIG. 5 is a cross-sectional schematic view depicting the method for manufacturing the inkjet recording head.

A method for manufacturing a piezoelectric element in accordance with the present invention will now be described. FIGS. 4 and 5 are cross-sectional schematic views depicting the method for manufacturing a piezoelectric element and an inkjet recording head in accordance with an embodiment of the present invention.

Oxide Film Formation Step (S1)

It is a step in which a silicon substrate constituting a pressure chamber substrate 20 is heat-treated in an oxidizing atmosphere containing oxygen or water vapor to form an oxide film 31 composed of silicon oxide ($SiO_2$). In this step, CVD may also be used in stead of the commonly used thermal oxidation.

Step for Forming $ZrO_2$ Film (S2)

It is a step in which a $ZrO_2$ film 32 is formed on the oxide film 31, which is itself formed on one side of the pressure chamber substrate 20. The $ZrO_2$ film 32 is obtained by a process forming a Zr layer by sputtering or vacuum vapor deposition and heat-treating the Zr layer in an oxygen atmosphere.

Step for Forming Bottom Electrode (S3)

An Ir-containing bottom electrode 42 is formed on the $ZrO_2$ film 32. For example, an Ir-containing layer is first formed, a Pt-containing layer is subsequently formed, and an Ir-containing layer is then formed.

The layers constituting the bottom electrode 42 are formed by individually depositing Ir or Pt on the $ZrO_2$ film 32 by sputtering or the like. An adhesive layer (not shown) composed of titanium or chromium is preferably formed by sputtering or vacuum vapor deposition before the bottom electrode 42 is formed.

Patterning Step Following the Formation of Bottom Electrode (S4)

To separate the bottom electrode thus formed from the bottom wiring electrode 42a, patterning is first performed by masking the bottom electrode 42 in the desired configuration and etching the adjacent areas. Specifically, a resist material having a uniform thickness is applied to the bottom electrode by spinning, spraying, or the like (not shown); a mask is formed in the shape of piezoelectric elements; exposure and development are then performed to form a resist pattern on the bottom electrode (not shown). The bottom electrode is etched away by ion milling, dry etching, or another technique commonly used, and the $ZrO_2$ film 32 is exposed.

Cleaning (not shown) is subsequently performed by ashing or the like in order to remove the contaminants, oxidized portions, and other species deposited on the surface of the bottom electrode during the patterning step.

Step for Forming Ti Nucleus (Layer)

It is a step in which a Ti nucleus (layer) (not shown) is formed on the bottom electrode 42 by sputtering or the like. The reason why a Ti nucleus (layer) is formed is that growing PZT by using a Ti crystal as this nucleus causes crystal growth to proceed from the side facing the bottom electrode and yields dense columnar crystals.

In addition, the mean thickness of the Ti nucleus (layer) is 3–7 nm, and preferably 4–6 nm.

Step for Forming Piezoelectric Precursor Film (S5)

It is a step in which a piezoelectric precursor film 43' is formed by the sol-gel technique.

A sol comprising an organic metal alkoxide solution is first applied to the Ti nucleus layer by spin coating or another application technique. The product is subsequently dried at a given temperature for a given time, and the solvent is vaporized. After the product is dried, the product is degreased at a specific temperature for a given time in the atmospheric environment to cause the organic ligands coordinated to the metal to pyrolyze and to form a metal oxide. The steps involving application, drying, and degreasing are repeated (for example, twice), and a piezoelectric precursor film that comprises two layers is layered. The metal alkoxide and acetate in the solution are formed into a metal/oxygen/metal network via ligand pyrolysis by such drying and degreasing treatments.

This step is not limited to the sol-gel technique and may also be performed by MOD (Metal Organic Deposition).

Annealing Step (S6)

It is a step in which the piezoelectric precursor film 43' is annealed after being formed, and crystallized to form a piezoelectric material layer. As a result of this annealing, the piezoelectric precursor film 43' assumes a rhombohedral crystal structure from an amorphous state, converts to a thin layer that exhibits an electromechanical conversion action, and becomes a piezoelectric material layer whose degree of orientation in the 100 plane is 75% or greater, as measured by the X-ray diffraction wide angle technique. In the annealing step, the heating is preferably conducted from the side of the bottom electrode. Orientation can be controlled in a more reliable manner because the crystals are caused to grow from the side of the bottom electrode by conducting heating from the side of the bottom electrode.

The piezoelectric thin film 43 can be fashioned in the desired thickness by repeating the formation (S5) and annealing (S6) of such a precursor film a plurality of times. For example, the thickness of the precursor film applied per annealing cycle may be set to 200 nm, and the operations repeated six times.

The crystal growth in the layers formed by the second and subsequent annealing cycles is affected by the sequential underlying piezoelectric material layers, and the degree of orientation in the 100 plane reaches 75% or greater throughout the entire piezoelectric thin film 43.

In particular, the annealing temperature of the initial cycle from among six annealing cycles is made higher than the annealing temperature of the other cycles in the present embodiment. When the annealing temperature is increased, the proportion of the $PbTiO_3$ that crystallizes in the initial stage of annealing also increases, and this believed to cause PZT to grow on a nucleus. $PbTiO_3$ is a cubic crystal with the 100 orientation at a temperature above the Curie point. Obtaining a PZT with a high degree of orientation in the 100 plane is attributed to this fact.

In addition, the same effect can be obtained when the annealing time of the initial cycle is made longer than the annealing time of the other cycles. It is further possible to combine raising the annealing temperature of the initial cycle above the annealing temperature of the other cycles with making the annealing time of the initial cycle longer than the annealing time of the other cycles.

In the present embodiment, a piezoelectric thin film with a high degree of orientation in the 100 plane can thereby be obtained in the initial annealing step. The piezoelectric characteristics of the entire piezoelectric thin film 43 can be improved because the crystallization in the annealing steps of the other cycles is affected by the crystal orientation of the piezoelectric material layer formed in the initial cycle. Another feature of the present embodiment is that the interdiffusion or oxidation of the bottom electrode 42 can be minimized, as can the Pb diffusion, in the annealing steps of cycles other than the initial cycle. A uniform, highly reliable piezoelectric thin film 43 can thereby be obtained.

Top Electrode Formation Step (S7)

The top electrode 44 is formed by electron beam vapor deposition or sputtering on the piezoelectric thin film 43.

Piezoelectric Thin Film and Top Electrode Removal Step (S8)

It is a step in which the piezoelectric thin film 43 and top electrode 44 are patterned in the specific shape of piezoelectric elements. Specifically, a resist is applied by spin coating to the top electrode 44, a match is established with the positions in which pressure chambers are to be formed, exposure and development are conducted, and patterning is carried out. The top electrode 44 and piezoelectric thin film 43 are etched by ion milling or the like, with the remaining resist being used as a mask. Piezoelectric elements 40 are formed in the above steps.

Band Electrode Formation Step (S9)

A band electrode 45 for providing a connection path to the top electrode 44 and the bottom wiring electrode 42a is subsequently formed. The material of the band electrode 45 is preferably a metal with low rigidity and low electric resistance. Aluminum, copper, or the like may be used. The band electrode 45 is formed in a thickness of about 0.2 $\mu$m, and patterning is then carried out to leave behind portions that provide conduction paths to the top electrode and the bottom electrode used for connection purposes.

Pressure Chamber Formation Step (S10)

The side of the pressure chamber substrate 20 opposite from the one on which the piezoelectric elements 40 have been formed is subsequently subjected to anisotropic etching, parallel-plate reactive ion etching, or another type of anisotropic etching featuring an inert gas, and pressure chambers 21 are formed. The remaining unetched portions serve as side walls 22.

Step for Laminating Nozzle Plate (S11)

A nozzle plate 10 is finally laminated to the etched pressure chamber substrate 20 with the aid of an adhesive. The parts being laminated are aligned such that the nozzles 11 are disposed in the spaces of the pressure chambers 21. The pressure chamber substrate 20 with the laminated nozzle plate 10 is mounted in a casing (not shown), completing the inkjet recording head 1.

6. Manufacturing Method According to the Second Embodiment

The manufacturing method according to the second embodiment differs from the first embodiment in terms of the annealing conditions established in the step (S6) for annealing the precursor film, with the other elements being the same as in the manufacturing method according to the first embodiment.

Although in the first embodiment the annealing temperature of the first cycle was set higher than the annealing temperature of the other cycles, it was learned that a highly reliable piezoelectric thin film could also be obtained when the annealing temperature was kept the same for each layer. In particular, in a piezoelectric thin film, the degree of orientation in the (100) plane on a portion adjacent to the top electrode was higher than the degree of orientation in the (100) plane on a portion adjacent to the bottom electrode. It was obtained by repeating the combination of the step of forming a piezoelectric precursor film and the step of performing heating from the side of the bottom electrode for a plurality of times after forming the Ti nucleus (layer) on the bottom electrode.

Figure 6:
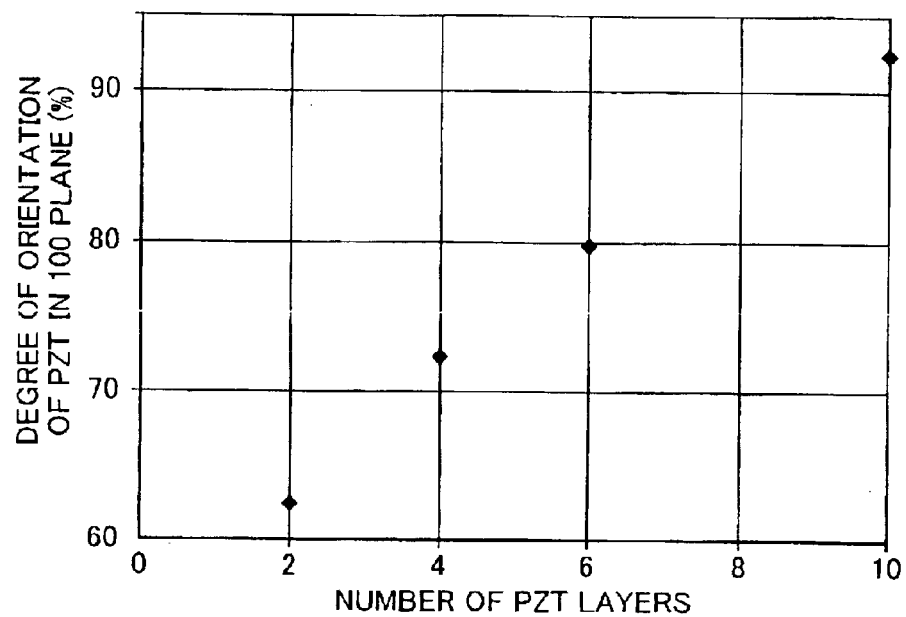
FIG. 6 is a graph depicting the 100 degree of orientation in each of the layers of a piezoelectric thin film manufactured by the manufacturing method of the second embodiment.

FIG. 6 is a graph depicting the 100 degree of orientation in each of the layers of the piezoelectric thin film manufactured by the manufacturing method of the second embodiment. As can be seen in the figure, the degree of orientation in the (100) plane is about 65% in the layer adjacent to the bottom electrode, and the degree of orientation in the (100) plane continuously increases with layering, producing a value of about 80% in the sixth layer, and a value of about 92% in the tenth layer.

Figure 7:
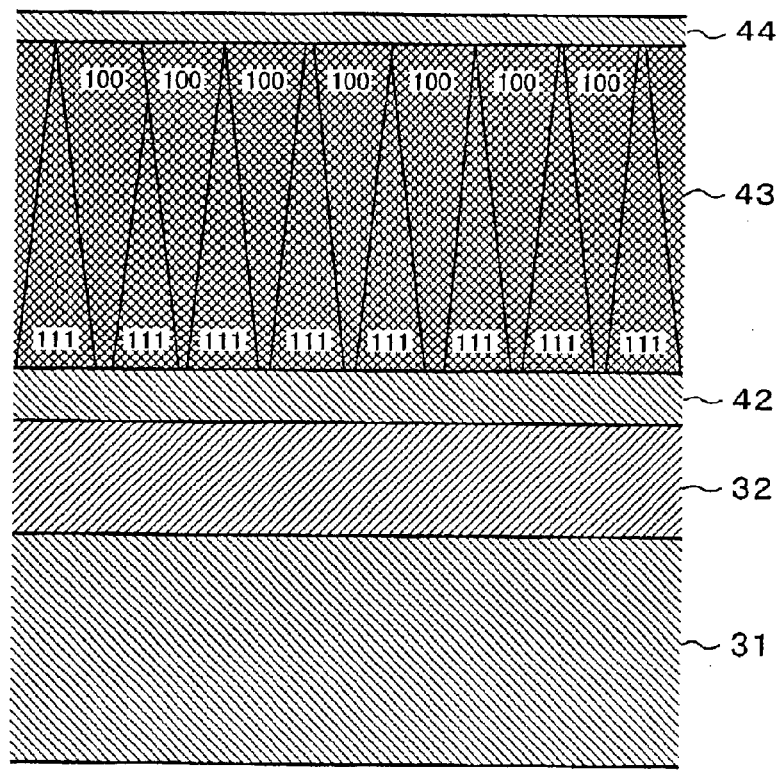
FIG. 7 is a cross-sectional view schematically depicting the condition of columnar crystals in a piezoelectric thin film manufactured by the manufacturing method of the second embodiment.

An examination of the crystal structure of the piezoelectric thin film revealed the presence of continuous columnar crystals that stretch from the bottom electrode to the top electrode. FIG. 7 is a cross-sectional view schematically depicting the condition of the colunmar crystals in the piezoelectric thin film manufactured by the manufacturing method of the second embodiment. As can be seen in the figure, the first layer of the piezoelectric thin film that has formed immediately above the bottom electrode has a high proportion of orientation in the (111) plane. A PZT layer oriented in the (111) plane tends to form on the PZT layer oriented in the (111) plane, but the proportion of orientation in the (100) plane gradually increases in the direction toward the top electrode. A PZT layer oriented in the (100) plane forms on the PZT layer oriented in the (100) plane. PZT columnar crystals oriented in the (111) plane and PZT columnar crystals oriented in the (100) plane are formed as a result, as shown in the figure. This is attributed to the fact that the crystal growth rate of a PZT film oriented in the 100 plane is higher than that of a PZT film oriented in the 111 plane.

It should be noted that, because a piezoelectric element containing the piezoelectric thin film 43 is layered on a diaphragm containing the oxide film 31 and $ZrO_2$ film 32 in the manner shown in FIG. 7, the neutral line of vibration shifts away from the center of the piezoelectric thin film and toward the bottom electrode. Consequently, the internal stress generated in the piezoelectric thin film and bottom electrode can be reduced by reducing the piezoelectric characteristics on the side of the bottom electrode adjacent to the neutral line, and enhancing the piezoelectric characteristics on the side of the top electrode farther away from the neutral line. Since the degree of orientation in the (100) plane on the side of the top electrode is made higher than that on the side of the bottom electrode, it is possible to impede the generation of internal stress and to produce a highly reliable piezoelectric thin film when the piezoelectric thin film of the second embodiment is used as an actuator layered on a diaphragm.

7. Examples

A step in which annealing was performed with every two applications of a PZT precursor film to form a PZT layer was repeated six times, yielding a PZT thin film whose overall thickness was 1.3 $\mu$m. Table 1 shows the degrees of orientation in the 100 plane of PZT obtained when the annealing conditions of last five cycles out of the total of six cycles were set to 700° C. and 30 minutes, and the annealing conditions of the initial cycle were varied. The temperature at which interdiffusion occurred in the layered bottom electrode was 700° C.

TABLE 1

| | Annealing conditions of the initial cycle | Degree of orientation in the 100 plane |
|---|---|---|
| Example B1 | 700° C., 30 minutes | 72% |
| Example A1 | 700° C., 60 minutes | 83% |
| Example A2 | 750° C., 30 minutes | 75% |
| Example A3 | 800° C., 30 minutes | 86% |

A preferred degree of orientation in the 100 plane was obtained by making the annealing time of the initial cycle greater than the annealing time of the other cycles in accordance with the first embodiment, as in example A1. In addition, a preferred degree of orientation in the 100 plane was obtained by raising the annealing temperature of the initial cycle above the annealing temperature of the other cycles, as in examples A2 and A3. In particular, a preferred degree of orientation in the 100 plane was obtained when the annealing temperature of the initial cycle was set to 800° C.

The degree of orientation in the 100 plane in example B1 is the mean value for the entire piezoelectric thin film, and the details of example B1 are the same as those described above with reference to the manufacturing method of the second embodiment.

8. Manufacturing Method According to Third Embodiment

The manufacturing method of the third embodiment is the same as the manufacturing method of the first embodiment except that a sol-gel technique in which the sol used has a different composition than in the first embodiment is employed in the step (S5) for forming the piezoelectric precursor film.

In the step in which a piezoelectric material layer composed of PZT is formed a plurality of times to produce a piezoelectric thin film in accordance with the third embodiment, the Zr/Ti ratio of the sol in the first layer of the two-layer piezoelectric precursor film applied in the first film formation cycle is made higher than the Zr/Ti ratio of the sol in the second layer or of the sol in the piezoelectric precursor applied in the other film formation cycles. For example, the Zr/Ti ratio of the sol in the first layer is set to 58/42, and the Zr/Ti ratio of the sol in the remaining layers is set to 55/45 when the sol in the first layer is applied in a thickness of 100 nm. The Zr/Ti ratio should be changed to an appropriate value depending on the thickness of the Ti layer formed on the bottom electrode or the thickness of the sol in the first applied layer.

Figure 8A:
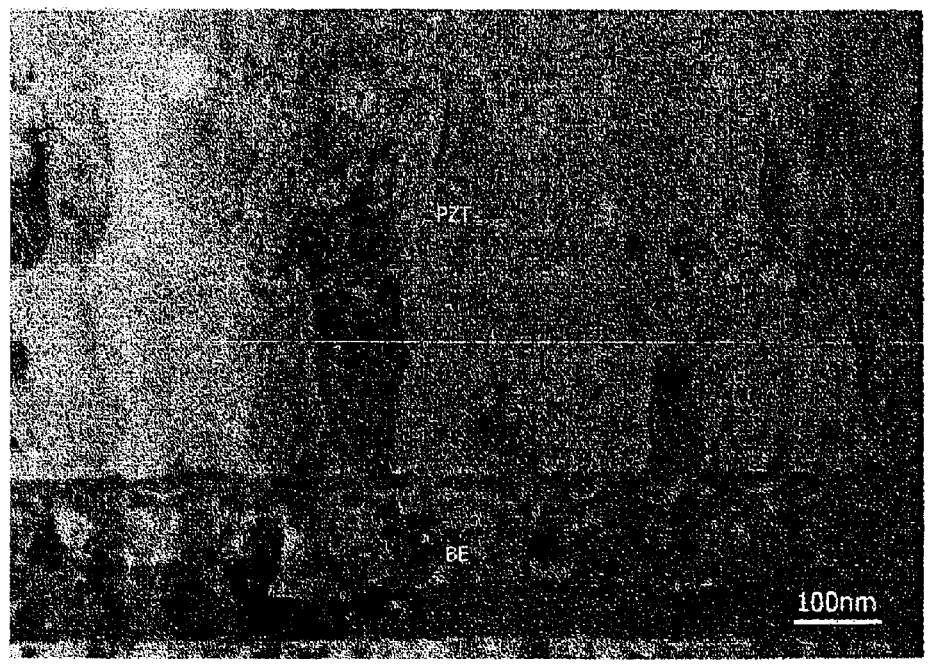
FIG. 8A is a TEM photograph of a piezoelectric element obtained by a conventional manufacturing method.
Figure 8B:
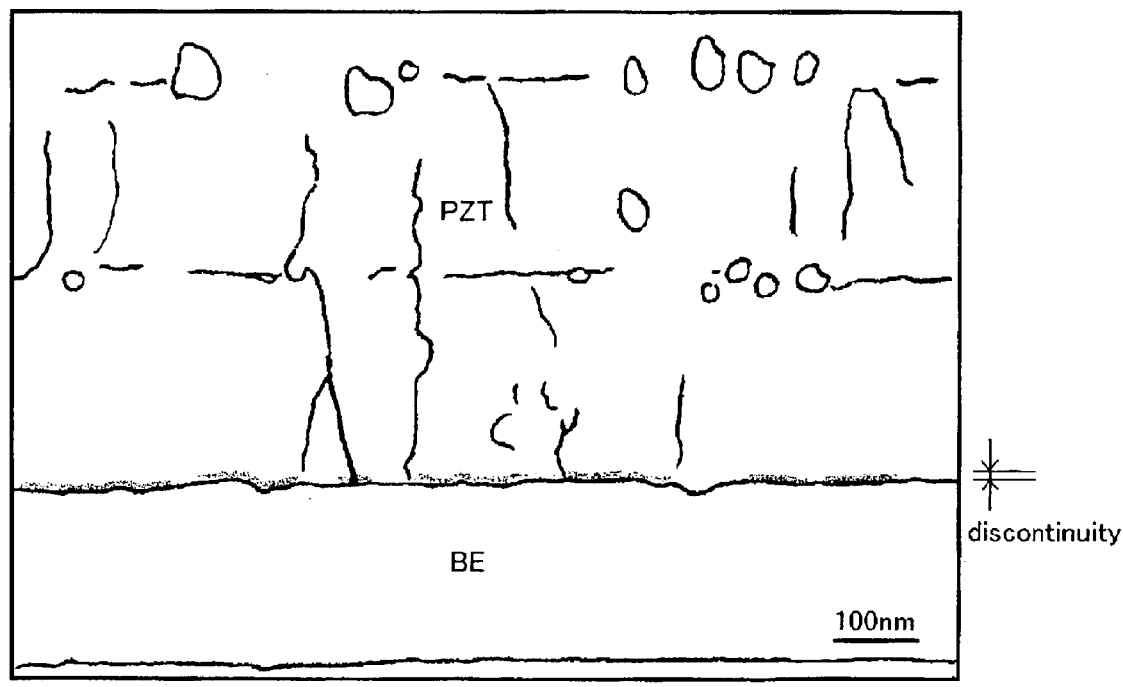
FIG. 8B is a schematic drawing thereof.
Figure 9A:
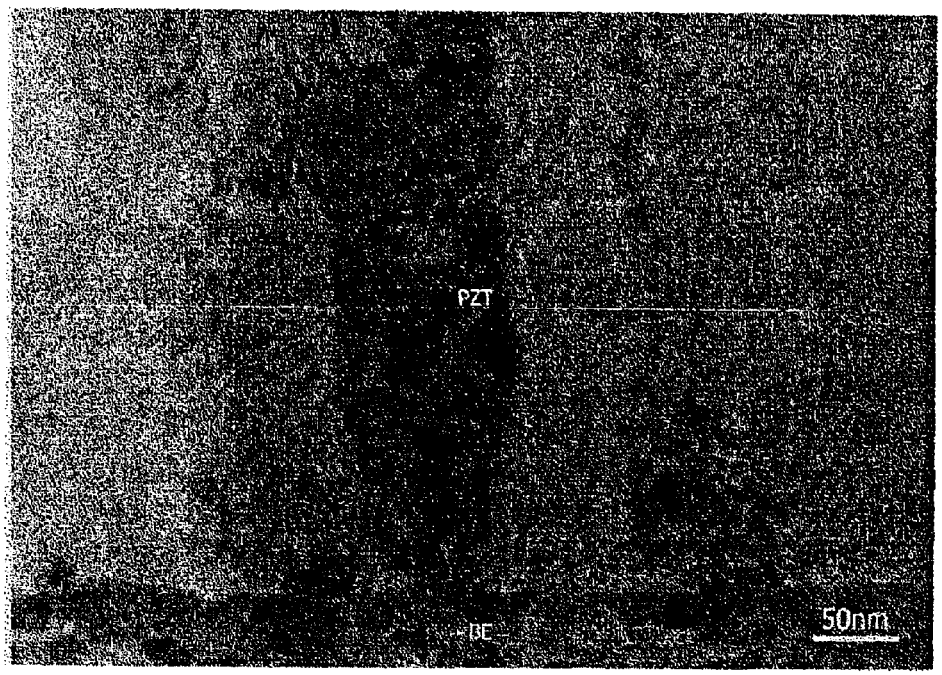
FIG. 9A is an enlarged photograph of FIG. 8A.
Figure 9B:
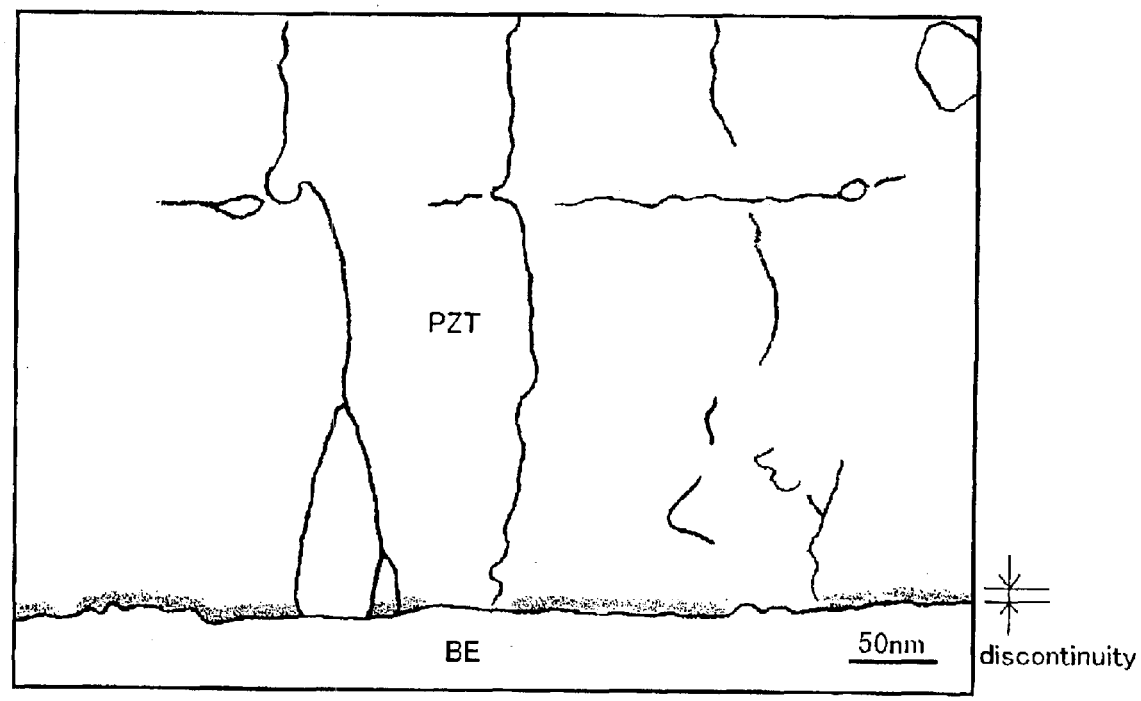
FIG. 9B is a schematic drawing thereof.

In the piezoelectric thin film 43 thus obtained, the composition of the area adjacent to the interface with the bottom electrode 42, and the Zr/Ti ratio in particular, is uniform in the film thickness direction. FIGS. 8A and 9A are TEM photographs taken when the Zr/Ti ratio of the sols in all the layers was set to 55/45. Discontinuities of about 5 nm are present on the bottom electrode. These are composed of a piezoelectric material rich in Ti. No piezoelectric material layers rich in Ti can be found in a piezoelectric material film according to the present invention.

9. Other Application Examples

The present invention is not limited to the above-described embodiments and can be modified and applied in a variety of ways. For example, a piezoelectric element manufactured in accordance with the present invention can be applied not only to the manufacture of piezoelectric elements for the above-described inkjet recording head, but also to the manufacture of ferroelectric devices, dielectric devices, pyroelectric devices, piezoelectric devices, and electro-optic devices such as nonvolatile semiconductor memory devices, thin-film capacitors, pyroelectric detectors, sensors, surface-acoustic-wave optical waveguides, optical memory devices, spatial light modulators, and frequency doublers for diode lasers.

Furthermore, the liquid jetting head of the present invention can be applied to the following devices in addition to the ink-jetting heads used in inkjet recording devices: heads for ejecting liquids that contain colorants used in the manufacture of color filters for liquid-crystal displays and the like; heads for ejecting liquids that contain electrode materials used in the formation of organic EL displays, FEDs (field emission displays), and the like; heads for ejecting liquids that contain bioorganic matter used in biochip production; and heads for spraying various other liquids.

According to the present invention, a piezoelectric element having consistently high piezoelectric characteristics, and a method for manufacturing a liquid jetting head in which this element is used, can be provided by stabilizing and obtaining with good reproducibility a degree of orientation that is suitable for a piezoelectric thin film. It is also possible to provide a highly reliable piezoelectric element in which the in-film stress of the piezoelectric material film and bottom electrode is reduced, and to provide a liquid jetting head in which this element is used.

It is further possible to provide a method capable of yielding a piezoelectric thin film whose composition is uniform in the film thickness direction, and of reducing the in-film stress; to provide a piezoelectric element endowed with good piezoelectric characteristics and reliability; and to provide an inkjet recording head in which this element is used.

What is claimed is:

1. A piezoelectric element obtained by the sequential layering of a diaphragm, a bottom electrode, a piezoelectric thin film, and a top electrode, wherein the piezoelectric thin film is a PZT predominantly oriented in the (100) plane wherein the degree of orientation in the (100) plane is greater than 70%; and wherein the degree of orientation in the (100) plane is different between a portion of the piezoelectric thin film facing the bottom electrode and a portion of the piezoelectric thin film facing the top electrode.

2. The piezoelectric element according to claim 1, wherein the degree of orientation in the (100) plane of the portion of the piezoelectric thin film facing the top electrode is higher than the degree of orientation in the (100) plane of the portion facing the bottom electrode.

3. The piezoelectric element according to claim 1, wherein the piezoelectric thin film comprises continuous columnar crystals that extend from a side of the bottom electrode to a side of the top electrode.

4. A piezoelectric element comprising a bottom electrode, a piezoelectric thin film formed on the bottom electrode, and a top electrode formed on the piezoelectric thin film, wherein at least portions of the piezoelectric thin film near an interface with the bottom electrode have a uniform composition in the film thickness direction except at crystal grain boundaries of the piezoelectric material, wherein the piezoelectric thin film is a PZT with a degree of orientation in the (100) plane of greater than 70%.

5. A liquid jetting head comprising:

a piezoelectric element according to claim 4;

pressure chambers for varying the capacity by the mechanical displacement of the piezoelectric elements; and nozzles connected to the pressure chambers and used to eject liquid drops.

* * * * *